(12) United States Patent
Hellberg

(10) Patent No.: US 6,385,439 B1
(45) Date of Patent: May 7, 2002

(54) LINEAR RF POWER AMPLIFIER WITH OPTICALLY ACTIVATED SWITCHES

(75) Inventor: Lars Richard Birger Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 08/962,329

(22) Filed: Oct. 31, 1997

(51) Int. Cl.[7] ............................................. H01Q 11/12
(52) U.S. Cl. ........................ 455/123; 455/127; 455/118
(58) Field of Search .................................. 332/144, 103, 332/105, 109; 455/91, 127, 103, 323, 118, 123, 313, 318; 359/180, 315, 181, 326; 327/103; 375/216, 295

(56) References Cited

U.S. PATENT DOCUMENTS

| | | | |
|---|---|---|---|
| 4,525,871 A | * 7/1985 | Foyt et al. | 455/325 |
| 4,570,079 A | 2/1986 | Davis | |
| 5,091,797 A | * 2/1992 | Proebster | 359/187 |
| 5,392,007 A | 2/1995 | Cripe | |
| 5,400,027 A | * 3/1995 | Moyal | 341/135 |
| 5,401,953 A | 3/1995 | Spencer et al. | 250/208.4 |
| 5,530,722 A | * 6/1996 | Dent | 375/298 |
| 5,703,902 A | * 12/1997 | Ziv et al. | 375/200 |
| 6,091,940 A | * 7/2000 | Sorrells et al. | 455/118 |
| 6,317,243 B1 | * 11/2001 | Price | 359/181 |

FOREIGN PATENT DOCUMENTS

| | | |
|---|---|---|
| EP | 0515074 | 11/1992 |
| EP | 0691733 | 1/1996 |

OTHER PUBLICATIONS

Razavi, Behzad, RF Microelectronics, Prentice–Hall, 1997, ISBN 0–13–887571–5, 1997.*

Johansson, Mat, "Linearization of Wideband RF Power Amplifiers Using Modulation Feedback", Department of Applied Electronics—Lund Institute of Technology, pp. 1–14.

* cited by examiner

*Primary Examiner*—Vivan Chang
*Assistant Examiner*—Charles N. Appiah
(74) *Attorney, Agent, or Firm*—Burns, Doane, Swecker & Mathis, L.L.P.

(57) ABSTRACT

A linear power amplifier amplifies a linear baseband signal having I and Q components. An up-converting mixer uses optically activated switches to mix the amplified baseband signal with a local oscillator signal at specified carrier frequency. The optically activated switches are activated according to a switching sequence that produces a constant impedance over each carrier frequency cycle. In this way, the optically activated switches prevents introduction of non-linearities during the up-conversion process.

37 Claims, 4 Drawing Sheets f(b)

fc

LINEAR RF POWER AMPLIFIER WITH OPTICALLY ACTIVATED SWITCHES

This invention generally relates to the field of radio frequency amplifiers, more particularly, to radio frequency amplifiers that linearly amplify radio frequency (RF) carrier signals.

BACKGROUND

Radio Frequency (RF) power amplifiers are used for transmission of low-frequency baseband signals that are modulated over radio frequency (RF) carrier signals. In communication systems that use multiple narrowband carriers, broadband CDMA channels, or where linear modulation formats are used, highly linear power amplifiers are needed to preserve the baseband signal's phase and amplitude. High linearity also prevents carrier signals from intermodulating with each other and avoids broadening of the spectra of the baseband signals, which causes interference in other channels.

Many methods are known that provide high efficiency for low-frequency linear amplifiers, such as Class D PWM switching, Sigma-Delta switching, etc. At low frequencies, feedback loops are commonly used for linearizing a baseband signal that may be amplified with high efficiency. In order to be communicated over RF channels, the baseband signal must be up-converted to an RF carrier signal, which is transmitted with high power. As a result, the linearity of the base band signal modulated over the high power carrier signal should be maintained.

Conventional methods for linearization in high-frequency power amplifiers include linear amplification with non-linear components (LINC), combined analog locked loop universal modulator (CALLUM), adaptive baseband predistortion, and Feedforward linearization. These and other linearization methods are described by Mats Johansson of Department of Applied Electronics-Lund Institute of Technology-in Linearization of Wideband RF power Amplifiers Using Modulation Feedback, which is hereby incorporated by reference. At high frequency, however, the application of a feedback loop complicates linearization. This is mainly due to the fact that phase shift around the feedback loop increases with frequency. It is also difficult to achieve high efficiency with high power amplifiers at high frequency.

In order to overcome complications associated with linearization at high frequency, one conventional approach linearizes a baseband signal before up-converting it. This approach applies a linearized baseband signal at a low-power stage to an up-converting mixer, which mixes the baseband signal with a local oscillator signal to produce the carrier signal. Then, the up-converted baseband signal is amplified by a high-power stage at high frequency. FIGS. 1(a) and 1(b) show the spectra of a signal at baseband and carrier frequency, respectively. However, due to its switching characteristics, a conventional up-converting mixer often reintroduces non-linearities to the generated carrier signal. Furthermore, the high-power stage usually includes one or more RF power transistors that amplify the up-converted baseband signal. RF power transistors, however, have lower gain, lower efficiency, and lower power than power transistors that amplify baseband signals. The RF power transistors are also more susceptible to reactive coupling at carrier frequency than at baseband. It is also easier to linearize and amplify at baseband. Consequently, RF power transistors cause amplitude-to-phase distortion in addition to amplitude distortion.

Therefore, there exists a need for an efficient power amplifier that provides a high power linear carrier signal at high frequencies.

SUMMARY

Briefly, the present invention that addresses this need is exemplified in a linear power amplifier that mixes a local oscillator signal with a linear baseband signal using optically activated switches that are activated according to a switching sequence.

The linear amplifier includes an amplifier stage that amplifies the baseband signal, which has linear In-phase (I) and Quadrature-phase (Q) components. A local oscillator generates a local oscillator signal with a specified carrier frequency to be mixed with the linear baseband signal. An up-converting mixer includes a plurality of optically activated switches that are switched according to the switching sequence to mix the local oscillator signal with the linear baseband signal, without re-introducing non-linearities. Preferably, a filter stage isolates the amplifier stage from the up-converting mixer. An optical controller controls the switching sequence in a way that a constant impedance is presented over each carrier frequency cycle. According to the switching sequence, the optical controller activates the optically activated switches during corresponding fractions of the carrier frequency cycles. A fraction of a carrier frequency cycle during which an optically activated switch is closed is defined as duty cycle of the switch and is expressed in terms of a percentage. Therefore, the periods of the optically activated switches are percentages of time during the carrier frequency cycle that the switches are closed. In order to present the constant impedance, the switching sequence is selected such that none of the optically activated switches are closed concurrently. Therefore, the duty cycles of the optically activated switches are non-overlapping.

According to some of the more detailed features of the invention, the power amplifier stage includes a first power amplifier that produces a pair of complementary I components and a second power amplifier that produces a pair of complementary Q components. Using the optically activated switches, the up-converting mixer mixes the local oscillator signal with the pairs of complementary I and Q components.

In one exemplary embodiment, the plurality of the optically activated switches include first, second, third, and fourth optically activated switches that are respectively coupled to first and second complementary I components and first and second complementary Q components. Over repetitive carrier frequency cycles, each optically activated switch is activated during its corresponding fraction of the carrier frequency cycle. Preferably, for each optically activated switch, the duty cycle is equal to 25% of the carrier frequency cycle. Under this arrangement, the switching sequence sequentially closes the first optically activated switch, followed by the third optically activated switch, followed by the second optically activated switch, and finally the fourth optically activated switch.

In yet another more detailed feature of the invention, the optical controller includes one or more pulsed light sources, such as laser sources, for generating light pulses that control the optically activated switches according to the switching sequence. In one exemplary embodiment, the optical controller that controls the switching sequence has a single pulsed light source that is coupled to optic links having delay lines corresponding to fractions of the time period T of the frequency cycle, preferably, differing multiples of 0.25T. In another exemplary embodiment, the optical controller achieves the desired switching sequence by interleaving multiple pulsed light signals that are generated by corresponding phase-shifted local oscillator signals, which are applied to multiple pulsed light sources.

Other features and advantages of the present invention will become apparent from the following description of the preferred embodiment, taken in conjunction with the accompanying drawings, which illustrate, by way of example, the principles of the invention.

DETAILED DESCRIPTION

Figure 1A:
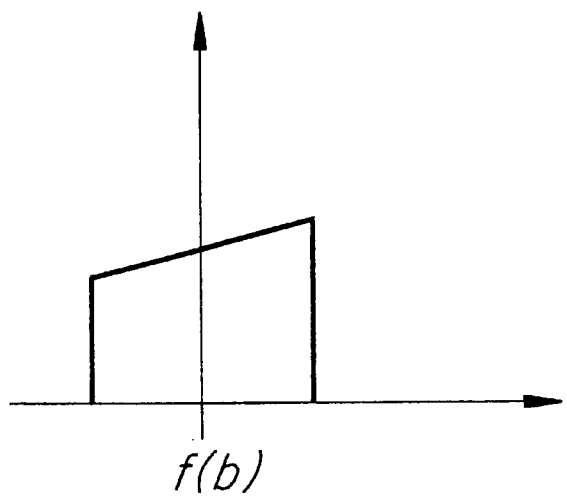
FIGS. 1(a) and 1(b) are diagrams of spectra of a signal at baseband and carrier frequency.
Figure 1B:
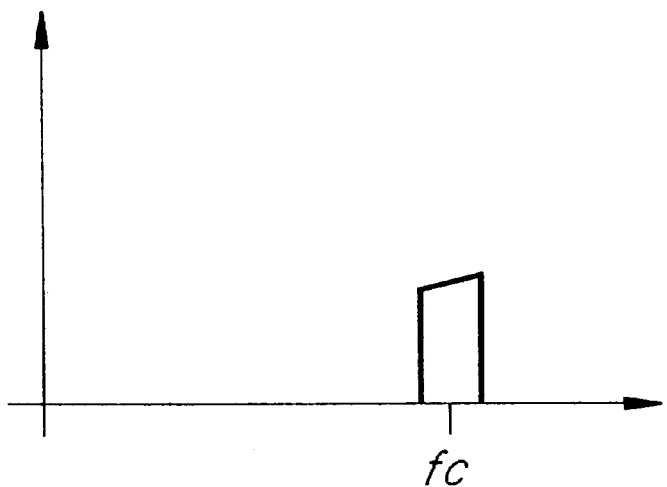
Figure 2:
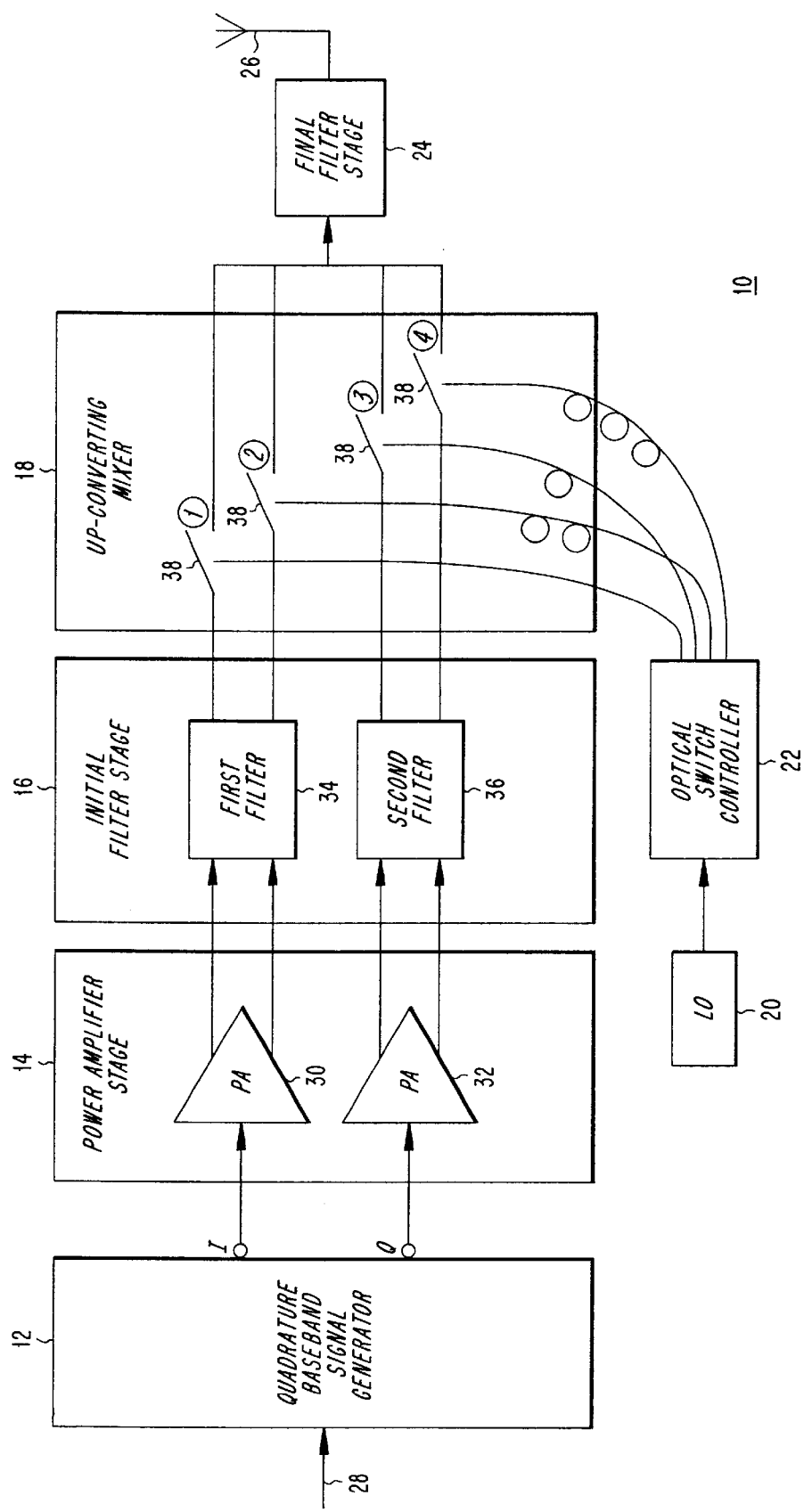
FIG. 2 is a block diagram of a transmitter that incorporates a power amplifier according to the present invention.

Referring to FIG. 2, a block diagram of a radio transmitter 10 that incorporates an exemplary power amplifier according to the invention is shown to include a quadrature baseband signal generator 12, a power amplifier stage 14, an initial filter stage 16, an up-converting mixer 18, a local oscillator 20, an optically activated switch controller 22, a final filter stage 24, and an antenna 26. The transmitter 10 is used for transmitting carrier signals that are modulated according to a well known modulation technique that requires a high degree of linearity to preserve both the amplitude and phase information of a modulating signal provided on line 28. For example, the transmitter 10 can be used in a Code Division Multiplex Access (CDMA) communication system for transmitting spread spectrum carrier signals. The transmitter can also be used for transmitting the sum of multiple narrowband channels, e.g., in a FDMA system.

The baseband signal generator 12 processes the modulating signal in a well known manner to produce a Quadrature baseband signal with In-phase (I) and Quadrature (Q) components. The amplifier stage 14 separately amplifies the Quadrature I and Q components of the baseband signal to a desired transmit power level, while maintaining the Quadrature component's linearity. The linearization of the baseband signal is accomplished via one of many known methods, including Class D PWM switching or Sigma-Delta switching. More specifically, the amplifier stage 14 includes a first power amplifier 30 that amplifies the I component of the Quadrature baseband signal. Similarly, a second power amplifier 32 amplifies the Q component of the Quadrature baseband signal. The first and second power amplifiers 30 and 32 are well known single-ended-to-double-ended amplifiers that amplify a single-ended input signal to produce a pair of complementary output signals, which are 180° out of phase from each other. As a result, the first amplifier 30 amplifies the I component to produce a pair of complementary I components, and the second amplifier 32 amplifies the Q component to produce a pair of complementary Q components. Each pair, includes components having a zero° or a 180° phase relationship relative to a reference phase angle. Thus, the pair of complementary I components has a first I component with a zero° phase and a second I component with a 180° phase. Similarly, the pair of complementary Q components has first and second Q components that are 180° out of phase from each other.

The initial filter stage 16, which isolates the amplifier stage 14 from the up-converting mixer 18, includes a first filter 34 and a second filter 36. The amplified complementary first and second I components provided by the first power amplifier 30 are applied to the first filter 34, and the amplified complementary first and second Q components provided by the second amplifier 32 are applied to the second filter 36. In the preferred embodiment of the invention, the first filter 34 and the second filter 36 may be low-pass or band-pass filters that present a known impedance to the up-converting mixer 18. The up-converting mixer 18 mixes the amplified complementary I and Q components pairs with a local oscillator signal provided by the local oscillator 20. In an exemplary embodiment the local oscillator comprises a programmable phased-lock loop that is programmed to produce the local oscillator signal at a specified carrier frequency. The final filter stage 24, which may be low-pass or band-pass filter, removes spurious frequencies at multiples of local oscillator frequency.

According to the present invention, the up-converting mixer 18 includes optically activated switches 38 the activations of which are controlled by the optically activated switch controller 22. The switches 38 act as virtually ideal switches with very low jitter. In this way, the optically activated switches 38 prevent the introduction of non-linearities into the mixing process. Therefore, the present invention takes advantage of ease of linearization and amplification efficiency at baseband frequency, while using optically activated linear switches 38 to perform the up-conversion function to carrier frequency, without re-introducing non-linearities into the up-conversion process. In response to the local oscillator signal, the optically activated switch controller 22 activates the optically activated switches 38 according to a switching sequence. The switching sequence is selected to present a constant impedance over each carrier frequency cycle. In an exemplary embodiment, the constant impedance is provided by closing the optically activated switches 38 during corresponding fractions of the carrier frequency cycles. A fraction of a carrier frequency cycle during which an optically activated switch is closed is defined as duty cycle of the switch and is expressed in terms of a percentage. Therefore, the periods of the optically activated switches are percentages of time during the carrier frequency cycle that the switches are closed. In order to present the constant impedance, the switching sequence is selected such that none of the optically activated switches are closed concurrently. Therefore, the duty cycles of the optically activated switches are non-overlapping.

In a preferred embodiment, each one of the optically activated switches 38 is closed according to the switching sequence with a 25% duty cycle. The switching sequence is selected such that only one switch is closed at any given moment during the carrier frequency cycle. Thus, the 'ON' periods of the optically activated switches 38 are non-overlapping. That is, the time period during which one optically activated switch 38 is switched 'ON' does not overlap with the time period during which another optically activated switch 38 is switched 'ON'. According to the invention, the carrier frequency may cover a broad range, including frequencies with sub-millimeter wave lengths. One technique for achieving optically activated switching within such a wide bandwidth is described in U.S. Pat. No. 5,401,953, which is hereby incorporated by reference.

In the exemplary embodiment of the invention, a first optically activated switch (shown by number 1) is closed to mix the first amplified I component with the local oscillator signal. Subsequently, after opening the first optically activated switch, a third optically activated switch (shown by number 3) is closed to mix the first amplified Q component with the local oscillator signal. When the third optically activated switch completes its 25% duty cycle, a second optically activated switch (shown by number 2) is closed to mix the second I component with the local oscillator signal. While all other optically activated switches remain open, a fourth optically activated switch (shown by number 4) is closed during its 25% duty cycle. Thus, the optically activated switches 38 are closed over carrier frequency cycles in accordance with a switching sequence that sequentially closes the first optically activated switch, followed by the third optically activated switch, followed by the second optically activated switch, and then the fourth optically activated switch. With the start of a new carrier frequency cycle, the optical controller 22 repeats the aforementioned switching sequence.

Figure 3:
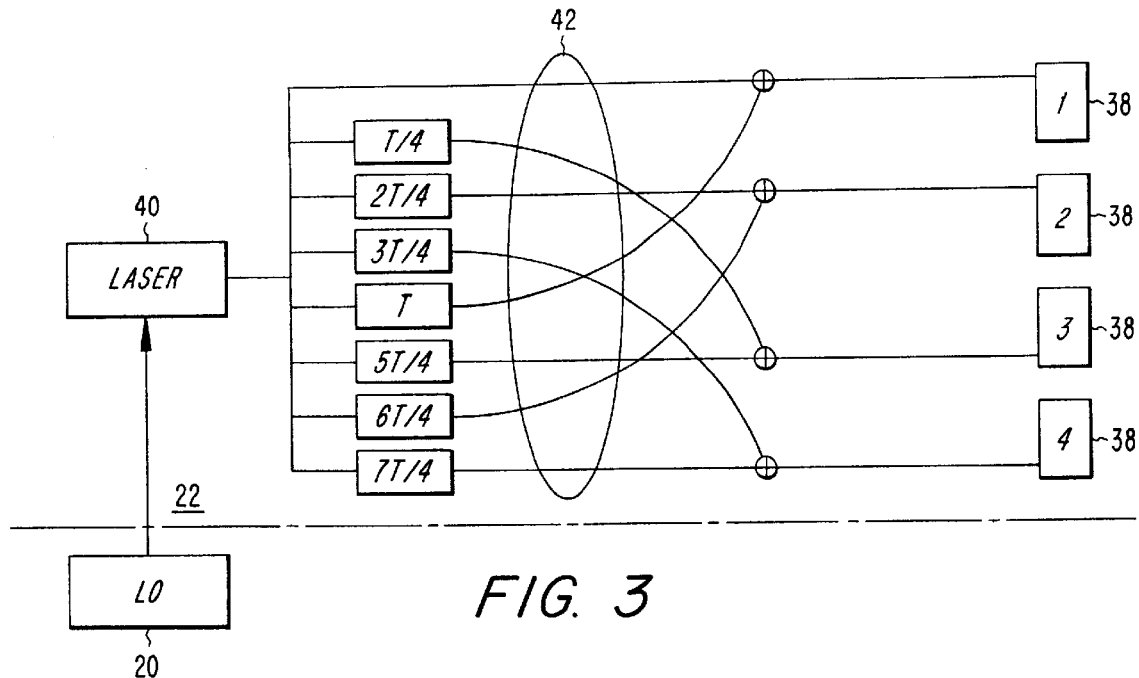
FIG. 3 is a block diagram of one exemplary optical controller of the power amplifier of FIG. 2.
Figure 4A:
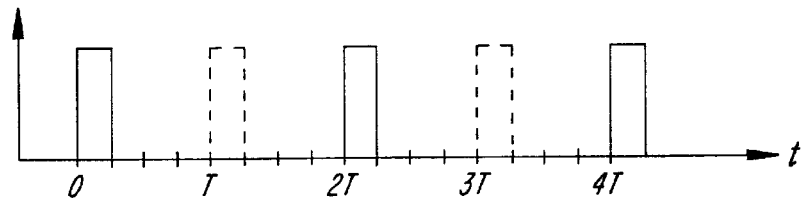
FIGS. 4(a), 4(b), 4(c), and 4(d) are diagrams of light pulses generated by the optical controller of FIG. 3.
Figure 4B:
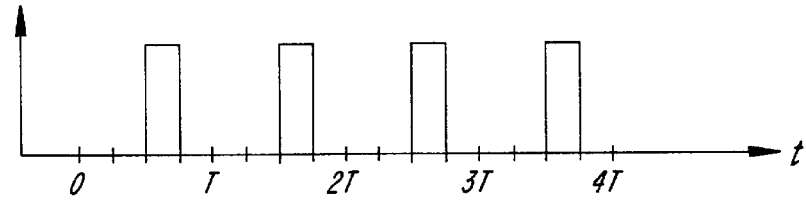
Figure 4C:
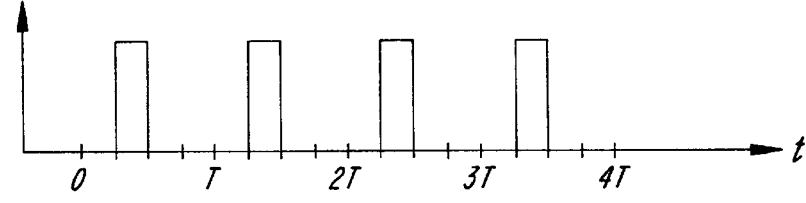
Figure 4D:
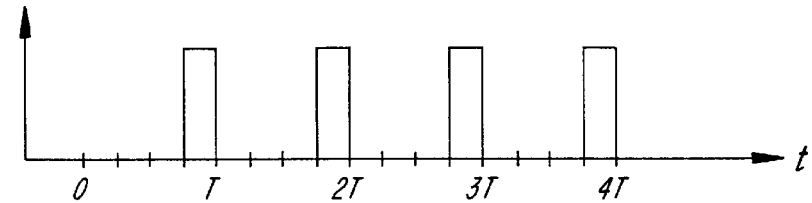

FIG. 3 shows one exemplary block diagram of the optically activated switch controller 22. The optically activated switch controller 22 includes a pulsed light source 40, such as a laser source, that is pulses by the local oscillator signal at a rate corresponding to the carrier frequency $f_c$ or a integer fraction N thereof. By pulsing the laser source at a rate of $f_c/N$, the number of pulsed light sources is decreased at the expense of increased number of optical links the number of optical links is equal to the number of switches 38, i.e., 4, times N, which in the exemplary embodiment of FIG. 3 is equal to 2. Consequently, eight optic links 42 are coupled between the pulsed light source 40 and the optically activated switches 38. Each optical link 42 has an associated delay-line that is relative to a period T of the carrier frequency cycle. In order to produce the switching sequence, the optic links 42 have differing multiples of 0.25-T delay-lines and the pulsed light source 40 is pulsed by the local oscillator 20 at a rate of $f_c/2$. Under this arrangement, an optical link 42 with no delay-line and an optical link with a delay line equal to T are coupled to the first optically activated switch (shown by number 1). Optical links with delay lines 2T/4 and 6T/4 are coupled to the second optically activated switch (shown by number 2). Optical links with T/4 and 5T/4 are coupled to the third optically activated switch (shown by number 3). Finally, optical links with 3T/4 and 7T/4 are coupled to the fourth optically activated switch (shown by number 4).

Referring to FIGS. 4(a), 4(b), 4(c), and 4(d), four diagrams showing the sequence of light pulses generated by the optically activated switch controller 22 for controlling each one of the first, second, third, and fourth optically activated switches 38 are shown, respectively. According to the shown laser pulse sequences, the optically activated switch controller 22 activates the optically activated switches 38 to achieve a constant impedance over a carrier frequency cycle. By using the arrangement of FIG. 3, the optically activated switches 38 are pulsed at a lower rate than that necessary when multiple pulsed light sources are used.

Figure 5:
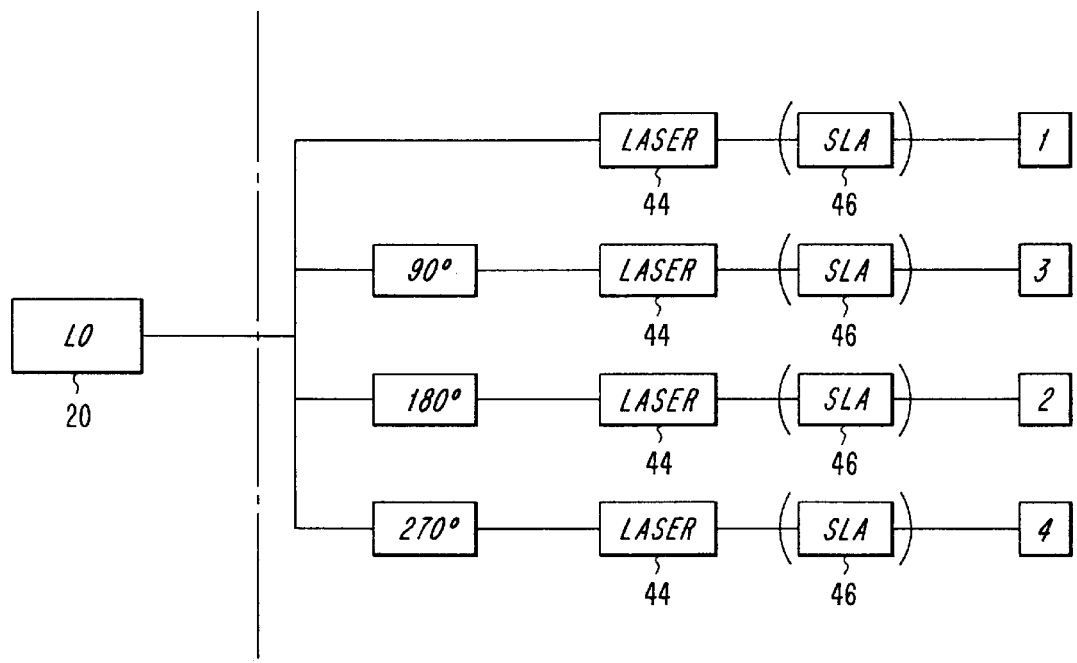
FIG. 5 is a block diagram of another exemplary optical controller of the power amplifier of FIG. 2.

Referring to FIG. 5, another exemplary diagram of the optical controller 22 that includes multiple pulsed light sources 44 is shown. Under this embodiment, the optical controller 22 achieves the desired switching sequence by interleaving multiple pulsed light signals that are generated by corresponding phase-shifted local oscillator signals. The local oscillator signal is branched to a 0°-phase-shifted signal, a 90°-phase-shifted signal, a 180°-phase-shifted signal, and a 270°-phase-shifted signal. These local oscillator phase shifted signals are applied to four pulsed light sources 44, e.g. laser sources, which control a corresponding number of semiconductor laser amplifier (SLAs) 46. In order to produce the switching sequence, the 0°-phase-shifted signal controls the activation of the first switch, the 90°-phase-shifted signal controls the activation of the third switch, the 180°-phase-shifted signal controls the activation of the second switch, and the 270°-phase-shifted signal controls the activation of the fourth switch. This arrangement produces the desired switching sequence for presenting a constant impedance over a carrier frequency cycle.

From the foregoing description it will be appreciated that the present invention performs power amplification at baseband where maximum efficiency and linearity can be achieved. Using substantially ideal optically activated switches, the invention performs the mixing function at high power, eliminating the nonlinearities of conventional low power mixers and high power RF amplifiers. Thus, the present invention provides for a simple, and small high power linear amplifier that can be fabricated using inexpensive components.

Although the invention has been described in detail with reference only to a preferred embodiment, those skilled in the art will appreciate that various modifications can be made without departing from the invention. Accordingly, the invention is defined only by the following claims which are intended to embrace all equivalents thereof.

What is claimed is:

1. A transmitter, comprising:

an amplifier stage that amplifies a baseband signal having linear In-phase (I) and Quadrature-phase (Q) components to produce an amplified baseband signal;

a local oscillator that generates a local oscillator signal corresponding to a specified carrier frequency; and an up-converting mixer that mixes the amplified baseband signal with the local oscillator signal, wherein the mixer includes a plurality of optically activated switches that are switched according to a switching sequence.

2. The transmitter of claim 1 farther including a filter stage for isolating the amplifier stage from the up-converting mixer.

3. The transmitter of claim 1, wherein the switching sequence presents a constant impedance over each carrier frequency cycle.

4. The transmitter of claim 1, wherein each one of the plurality of the optically activated switches are switched at time periods that are non-overlapping.

5. The transmitter of claim 1, wherein the amplifier stage includes a first power amplifier that produces a pair of complementary I components and a second power amplifier that produces a pair of complementary Q components, wherein said complementary I and Q components are mixed with the local oscillator signal via the optically activated switches.

6. The transmitter of claim 1, wherein the plurality of the optically activated switches include first, second, third, and fourth optically activated switches, wherein the complementary I components include a first I component coupled to the first optically activated switch and a second I component coupled to the second optically activated switch, wherein the complementary Q components include a first Q component coupled to the third optically activated switch and a second Q component coupled to the fourth optically activated switch, and wherein over each carrier frequency cycle, the switching sequence sequentially closes, during corresponding time periods, the first optically activated switch, followed by the third optically activated switch, followed by the second optically activated switch, and then the fourth optically activated switch.

7. The transmitter of claim 4, wherein the optically activated switches are switched with approximately 25% duty cycles.

8. The transmitter of claim 3 further including an optical controller for controlling the switching sequence.

9. The transmitter of claim 8, wherein the optical controller includes at least one pulsed light source that generates pulsed light signals for controlling the optically activated switches.

10. The transmitter of claim 9, wherein the pulsed light source is a laser source.

11. The transmitter of claim 9, wherein the switching sequence is produced by generating interleaved pulsed light signals.

12. The transmitter of claim 11, wherein the interleaved pulse signals are produced in response to phase-shifted local oscillator signals.

13. The transmitter of claim 9, wherein the optical controller includes a single pulsed light source and multiple optical links having associated delay-lines, wherein the delay lines correspond to a period T of the carrier frequency cycles.

14. The transmitter of claim 13, wherein the delay lines correspond to multiples of 0.25 times T.

15. A method for linearly transmitting an RF signal, comprising:
    amplifying a baseband signal having linear In-phase (I) and Quadrature (Q) components to produce an amplified baseband signal;
    generating a local oscillator signal corresponding to a specified carrier frequency; and
    mixing the amplified baseband signal with the local oscillator signal with a plurality of optically activated switches that are switched according to a switching sequence.

16. The method of claim 15, wherein the switching sequence presents a constant impedance over each carrier frequency cycle.

17. The method of claim 16, wherein each one of the plurality of the optically activated switches are switched at time periods that are non-overlapping.

18. The method of claim 15, wherein the step of amplifying produces a pair of complementary I components and a pair of complementary Q components, wherein said complementary I and Q components are mixed with the local oscillator signal via the optically activated switches.

19. The method of claim 18, wherein the plurality of the optically activated switches include first, second, third, and fourth optically activated switches, wherein the complementary I components include a first I component coupled to the first optically activated switch and a second I component coupled to the second optically activated switch, wherein the complementary Q components include a first Q component coupled to the third optically activated switch and a second Q component coupled to the fourth optically activated switch, and wherein over each carrier frequency cycle, the switching sequence sequentially closes, during corresponding time periods, the first optically activated switch, followed by the third optically activated switch, followed by the second optically activated switch, and then the fourth optically activated switch.

20. The method of claim 15, wherein the optically activated switches are switched with approximately 25% duty cycles.

21. The method of claim 15 further including the step of generating pulsed light signals for controlling the optically activated switches.

22. The method of claim 21, wherein the switching sequence is produced by generating interleaved pulsed light signals.

23. The method of claim 21, wherein the switching sequence is produced by multiple optical links having associated delay-lines, wherein the delay lines correspond to a period T of the carrier frequency cycles.

24. A transmitter, comprising:
    an antenna for radiating a linear signal that is modulated over a carrier signal;
    a radio transmitter coupled to the antenna, including:
    an amplifier stage that amplifies a baseband signal having linear In-phase (I) and Quadrature-phase (Q) components to produce an amplified baseband signal;
    a local oscillator that generates a local oscillator signal corresponding to a specified carrier frequency; and
    an up-converting mixer that mixes the amplified baseband signal with the local oscillator signal, wherein the mixer includes a plurality of optically activated switches that are switched according to a switching sequence.

25. The transmitter of claim 24 further including a filter stage for isolating the amplifier stage from the up-converting mixer.

26. The transmitter of claim 24, wherein the switching sequence presents a constant impedance over each carrier frequency cycle.

27. The transmitter of claim 24, wherein each one of the plurality of the optically activated switches is switched at time periods that are non-overlapping.

28. The transmitter of claim 24, wherein the amplifier stage includes a first power amplifier that produces a pair of complementary I components and a second power amplifier that produces a pair of complementary Q components, wherein said complementary I and Q components are mixed with the local oscillator signal via the optically activated switches.

29. The transmitter of claim 24, wherein the plurality of the optically activated switches include first, second, third, and fourth optically activated switches, wherein the complementary I components include a first I component coupled to the first optically activated switch and a second I component coupled to the second optically activated switch, wherein the complementary Q components include a first Q component coupled to the third optically activated switch and a second Q component coupled to the fourth optically activated switch, and wherein over each carrier frequency cycle, the switching sequence sequentially closes, during correspond ing time periods, the first optically activated switch, followed by the third optically activated switch, followed by the second optically activated switch, and then the fourth optically activated switch.

30. The transmitter of claim 29, wherein the optically activated switches are switched with approximately 25% duty cycles.

31. The transmitter of claim 27 further including an optical controller for controlling the switching sequence.

32. The transmitter of claim 31, wherein the optical controller includes at least one pulsed light source that generates pulsed light signals for controlling the optically activated switches.

33. The transmitter of claim 32, wherein the pulsed light source is a laser source.

34. The transmitter of claim 32, wherein the switching sequence is produced by generating interleaved pulsed light signals.

35. The transmitter of claim 34, wherein the interleaved pulse signals are produced in response to phase-shifted local oscillator signals.

36. The transmitter of claim 31, wherein the optical controller includes a single pulsed light source and multiple optical links having associated delay-lines, wherein the delay lines correspond to a period T of the carrier frequency cycles.

37. The transmitter of claim 36, wherein the delay lines correspond to multiples of 0.25 times T.

* * * * *